United States Patent
Yagisawa et al.

(10) Patent No.: US 8,283,565 B2
(45) Date of Patent: Oct. 9, 2012

(54) FLEXIBLE SUBSTRATE

(75) Inventors: Takatoshi Yagisawa, Kawasaki (JP); Tadashi Ikeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 197 days.

(21) Appl. No.: 12/071,584

(22) Filed: Feb. 22, 2008

(65) Prior Publication Data

US 2009/0000809 A1   Jan. 1, 2009

(30) Foreign Application Priority Data

Feb. 26, 2007   (JP) .................. 2007-045616

(51) Int. Cl.
*H05K 1/00*   (2006.01)

(52) U.S. Cl. ........ 174/254; 174/250; 361/748; 361/749; 361/398

(58) Field of Classification Search .............. 174/254, 174/250; 361/748, 749, 398
See application file for complete search history.

(56) References Cited

U.S. PATENT DOCUMENTS

| | | | |
|---|---|---|---|
| 4,901,039 A * | 2/1990 | Corzine et al. .................. 333/1 |
| 6,318,906 B1 | 11/2001 | Ishizaka |
| 7,265,719 B1 * | 9/2007 | Moosbrugger et al. ....... 343/700 MS |
| 2003/0142928 A1 | 7/2003 | Hirata et al. |
| 2004/0020687 A1 * | 2/2004 | Moore ......................... 174/254 |
| 2005/0052721 A1 * | 3/2005 | Guan et al. .................. 359/245 |
| 2005/0162840 A1 * | 7/2005 | Morita ......................... 361/784 |
| 2006/0082985 A1 * | 4/2006 | Naruse ......................... 361/784 |
| 2006/0110096 A1 | 5/2006 | Terada et al. |
| 2007/0081770 A1 | 4/2007 | Fisher |

FOREIGN PATENT DOCUMENTS

| | | |
|---|---|---|
| JP | 04-349686 | 12/1992 |
| JP | 09-055405 | 2/1997 |
| JP | 2000-91695 | 3/2000 |
| JP | 2002-062513 | 2/2002 |
| JP | 2003-222826 | 8/2003 |
| JP | 2003-264331 | 9/2003 |
| JP | 2004-235321 | 8/2004 |
| JP | 2004-296730 | 10/2004 |
| JP | 2004-320320 | 11/2004 |
| JP | 2005-303551 | 10/2005 |
| JP | 2006-147878 | 6/2006 |
| JP | 2006-338018 | 12/2006 |

OTHER PUBLICATIONS

Japanese Office Action for corresponding Japanese Application 2007-045616; mailed Jun. 28, 2011.

* cited by examiner

*Primary Examiner* — Yuriy Semenenko
*Assistant Examiner* — Andargie M Aychillhum
(74) *Attorney, Agent, or Firm* — Staas & Halsey LLP

(57) ABSTRACT

According to an aspect of an embodiment, a flexible circuit board for connecting a first device and a second device, the flexible circuit board comprises: a base material comprising a flexible material having a first end adapted to connect with the first apparatus, a second end adapted to connect with the second apparatus and a hollow arranged between the first end and the second end; a signal line arranged on a surface of the base material, the signal line capable of electrically connecting the first apparatus and the second apparatus, the signal line having a constant characteristic impedance along the signal line in association with the base material; and a line arranged on the base material and over the hollow, the line capable of electrically connecting the first apparatus and the second apparatus.

12 Claims, 11 Drawing Sheets

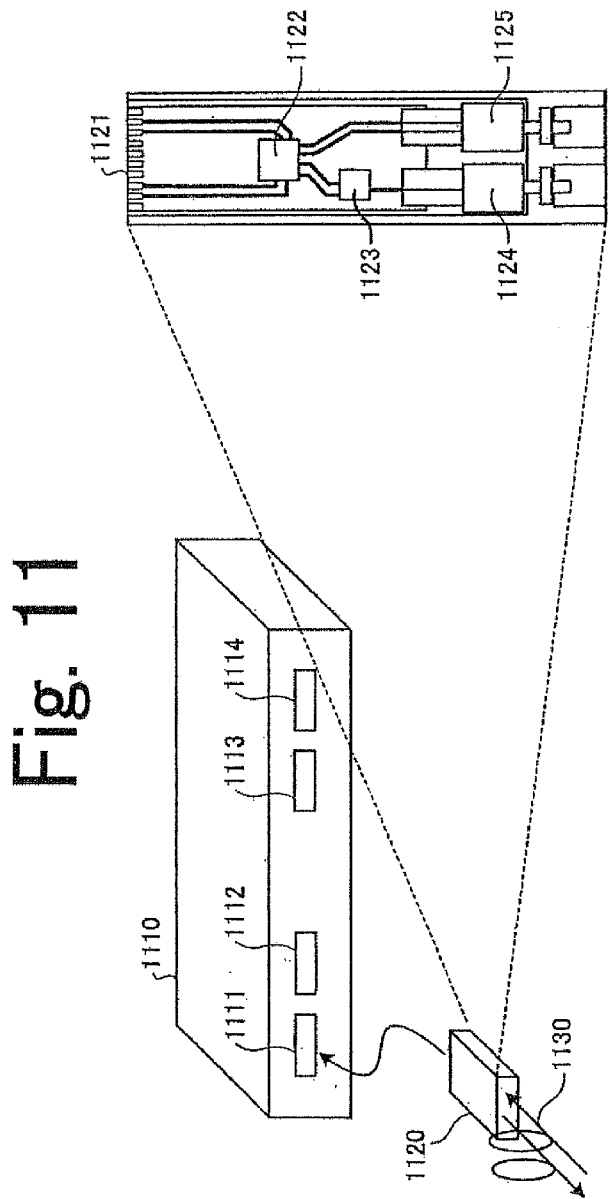

FLEXIBLE SUBSTRATE

FIELD OF THE INVENTION

The present art relates to a flexible substrate, an optical device, optical transmitter, and/or an optical receiver.

An optical transceiver including the optical transceiver and the transmitter used for an optical communication system advances in small size and low costs. For example, in the case of an optical transceiver of 10 Gbps, the standard of optical transceiver generally includes compact size and low consumption power, typically, such as X2 and XFP (10 Gigabit Small Form Factor Pluggable).

In accordance with this, even in the case of an electro/optic converting unit and an optic/electro converting unit used in the optical transceiver, the standards of small size, e.g., TOSA (Transmitter Optical SubAssembly) called an XMD-MSA (Miniature Device Multi Source Agreement) and ROSA (Receiver Optical Sub Assembly) type (receptacle type), are general. On the other hand, the increase in velocity is required for the optical communication system, an optical transceiver of 40 Gbps is developed and 100 G Ethernet (registered trademark) is discussed.

The conventional optical transmitter is a TOSA having a driver IC and a light emission element in a casing. The driver IC generates a drive signal that drives the light emission element on the basis of an electrical signal input from an electrical input portion arranged to the casing. As for the rest, the conventional optical transmitter driving method well known a direct driving of light emission element method and an Electro-Absorption Modulator Integrated Laser Diode (EML) driving method. The driver IC outputs the generated drive signal to the light emission element or the EML via a signal line. A mismatching portion (wire) with characteristic impedance of a signal line for passing the drive signal needs to be reduced.

Since the TOSA having the light emission element and an Electro-Absorption (EA) modulator needs to control temperature, the TOSA is arranged on a Peltier element, thereby thermally (actually, spatially) insulating the TOSA from another part (casing). In particular, for Electro-Absorption Modulator Integrated Laser Diode (EML) formed by integrating the EA and the light emission element, it is heated by itself at the operating time and various heat releasing structures are examined (e.g., Japanese Laid-open Patent Publication No. 2003-222826).

Further, such a structure for reducing the connection distance of a signal line with a holder shaped to bridge the elements is disclosed (e.g., specification of Japanese Patent No. 3353718). In addition, a structure for connecting a signal line with a flexible substrate is disclosed (e.g., Japanese Laid-open Patent Publication No. 2006-338018).

However, with the above-mentioned conventional arts, there is a problem that the positional deviation between an electrical input unit and an optical output unit in a casing causes that between the driver IC and the light emission element. This positional deviation is corrected with a wire and the driver IC is connected to the light emission element. Then, the connection distance with the wire is increased and high-frequency characteristics cannot be kept.

In the case of reducing the size of the optical transmitter, the distance between the light emission element (modulator) and Peltier element and the casing is close to each other. Therefore, there is a problem that the heat of the light emission element is not sufficiently released and the temperature control of the light emission element is not possible.

For example, the EA (Electro-Absorption) depends on the temperature, and has a problem that the modulation is not operated and an optical output is reduced when the temperature changes. In addition, the EML (EA Modulator integrated Laser diode: EA modulator integrated semiconductor laser) has a problem that the wavelength of an optical signal for light emission changes, in addition to the same problem of that of the EA.

In an optical transmitter 1500 in which a casing 1510 includes a driver IC 1520, the temperature control of a light emission element 1530 needs a long distance between the driver IC 1520 and the light emission element or EML 1530. On the other hand, if the distance between the driver IC 1520 and the light emission element 1530 is long, there is a problem that the high-frequency characteristics cannot be kept and an optical transmitter 1500 cannot be compact.

Further, the ROSA 1125 also has a problem that the positional deviation between an input unit and an electrical output unit in the casing causes the positional deviation between the electrical output unit and light receiving device. This positional deviation is corrected by the wire and the electrical output unit is simultaneously connected to the light receiving device. Then, there is a problem that the connection distance is long and the high-frequency characteristics cannot be kept.

SUMMARY

According to an aspect of an embodiment, a flexible circuit board for connecting a first device and a second device, the flexible circuit board comprises: a base material comprising a flexible material having a first end adapted to connect with the first apparatus, a second end adapted to connect with the second apparatus and a hollow arranged between the first end and the second end; a signal line arranged on a surface of the base material, the signal line capable of electrically connecting the first apparatus and the second apparatus, the signal line having a constant characteristic impedance along the signal line in association with the base material; and a line arranged on the base material and over the hollow, the line capable of electrically connecting the first apparatus and the second apparatus.

BRIEF DESCRIPTION OF THE DRAWINGS

FIG. 11 is a perspective view and a cross-sectional view showing an optical transceiver according to the embodiment.

DESCRIPTION OF THE PREFERRED EMBODIMENTS

These embodiments provide a flexible substrate for an optical device, an optical transmitter, and an optical receiver, in which high-frequency characteristics to be kept and the size of an optical apparatus to be reduced with the structure.

Hereinbelow, a description will be given of a flexible substrate, an optical part, an optical transmitter, and an optical receiver according to a preferred embodiment with reference to the drawings.

FIG. 11 is a perspective view and a cross-sectional view showing an optical communication system and an optical transceiver according to an embodiment. As shown in the perspective view in FIG. 11, an optical communication system 1110 comprises a plurality of ports 1111 to 1114, and an optical transceiver 1120 is inserted into the port 1111. An optical fiber 1130 is connected to the optical transceiver 1120. The optical transceiver 1120 transmits and receives optical signals to/from another communication system via the optical fiber 1130. As shown in the cross-sectional view in FIG. 11, the optical transceiver 1120 comprises: an electrical connector 1121; a recovery circuit 1122; a driver IC 1123; a TOSA 1124; and an ROSA 1125.

Upon inserting the optical transceiver 1120 to the port 1111 in the optical communication system 1110, the electrical connector 1121 is connected to the port 1111 of the optical communication system 1110. The electrical connector 1121 outputs the electrical signal output from the communication system 1110 to the circuit 1122. Further, the electrical connector 1121 outputs the electrical signal output from the recovery circuit 1122 to the communication system 1110.

The recovery circuit (CDR: Clock and Data Recovery) 1122 extracts a data signal and a clock signal from the electrical signal output from the electrical connector 1121, and outputs the resultant signals to the driver IC 1123. Further, the recovery circuit 1122 extracts a data signal and a clock signal from the electrical signal output from the ROSA 1125, and outputs the resultant signals to the electrical connector 1121.

The driver IC (Integrated Circuit) 1123 is a driver amplifier that outputs a drive signal for driving the TOSA 1124 to the TOSA 1124 on the basis of the electrical signal output from the recovery circuit 1122. The TOSA 1124 is an optical transmitter that transmits an optical signal via the optical fiber 1130 on the basis of the drive signal output from the driver IC 1123. The ROSA 1125 is an optical receiver that receives the optical signal via the optical fiber 1130. The ROSA 1125 outputs an electrical signal based on the received optical signal to the recovery circuit 1112.

Figure 1:
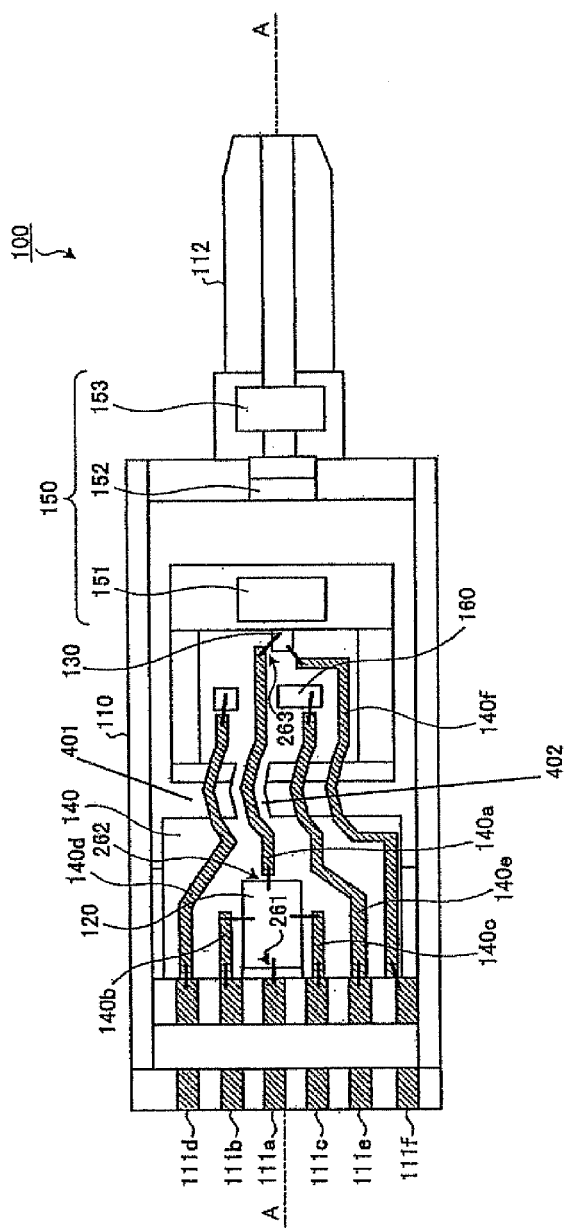
FIG. 1 is a plan view showing an optical transmitter according to an embodiment.

FIG. 1 is a plan view showing an optical transmitter according to the embodiment. Referring to FIG. 1, an optical transmitter 100 according to the embodiment comprises a driver IC 120, a light emission element 130, and a flexible substrate 140 in a casing 110. The casing 110 comprises a plurality of electrical input units 111a to 111f and an optical output unit 112.

The electrical input units 111a to 111f exist at one end of the casing 110. The electrical input units 111a to 111f receive an electrical signal and power. For example, the electrical input units 111a to 111f are ceramic terminals in which a metallic material is arranged on ceramics. An optical output unit 112 is arranged to the other end of the casing 110. Herein, the optical output unit 112 is a receptacle sequentially connected to a connector of another optical device. The optical output unit 112 outputs the output signal output from the casing 110 to another optical device.

The driver IC 120 is a drive circuit that outputs a drive signal for driving the light emission element 130. The driver IC 120 generates the drive signal on the basis of an electrical signal input from the electrical input unit 111a. The driver IC 120 outputs the drive signal generated via a flexible substrate 140 to the light emission element 130. The driver IC 120 is an amplifier that amplifies the electrical signal input from the electrical input unit 111a and sets the drive signal.

The driver IC 120 is connected to the electrical input unit 111a via a wire. In order to keep the high-frequency characteristics in the connection between the electrical input unit 111a and the driver IC 120, the driver IC 120 is arranged to match the position of the electrical input unit 111a. For example, the driver IC 120 is arranged at a position where a connection distance 261 to the electrical input unit 111a is within 375 μm. Herein, the driver IC 120 is arranged on one end of the flexible substrate 140.

The light emission element 130 generates an optical signal from the driver IC 120 on the basis of the drive signal output via the flexible substrate 140. The light emission element 130 outputs the generated optical signal to the outside via the optical output unit 112. The light emission element 130 is, e.g., an EA modulator or an EML chip.

Incidentally, an optical coupling unit 150 is provided on the transmitting side of the optical transmitter 100. The light emission element 130 outputs the generated optical signal via the optical coupling unit 150 and the optical output unit 112. Herein, the optical coupling unit 150 comprises a lens 151, a window 152, and a lens 153. The lens 151 is arranged between the light emission element 130 and the casing 110, and passes the optical signal output from the light emission element 130.

The window 152 is arranged to the casing 110, and has a function of an optical isolator that passes an optical signal only in the direction from the light emission element 130 to the optical output unit 112. The lens 153 is included in the optical output unit 112, and passes the optical signal that is output from the light emission element 130 and passes through the lens 151 and the window 152.

The light emission element 130 is arranged to match the position of the optical output unit 112 so as to output the optical signal to the optical output unit 112. For example, the light emission element 130 is arranged so that the precision of the positional deviation from the optical output unit 112 is within 100 μm. As mentioned above, the driver IC 120 is arranged to match the position of the electrical input unit 111a. On the other hand, the light emission element 130 is arranged to match the position of the optical output unit 112.

One end of the flexible substrate (FPC: Flexible Printed Circuits) 140 is connected to the electrical input units 111b to 111f. Further, the flexible substrate 140 is connected to the driver IC 120, and has a signal line 140a that outputs the drive signal output by the driver IC 120 to the light emission element 130. The signal line 140a is a high-frequency signal line, and impedance of the signal line 140a is kept to 50Ω. The FPC 140 has at least one hollow portion 401 around a remaining portion 402. The remaining portion 402 is narrower than other portion of the FPC 140 which is arranged on the Peltier element 203 and the driver IC 120. The hollow portion 401 is a part of the cutting out of the FPC 140. Therefore hollow portion 401 is a cutout portion. Also FPC 140 has a ground plane 620 arranged on opposite side of the signal line and the ground plane 620 extends from the driver IC 120 side end to the light emission element 130 side end via the remaining portion 402. The ground plane 620 is formed in accordance a base material of the FPC 140. Therefore, the signal line 140a has constant characteristic impedance along itself in association with the base material.

One of the flexible substrate 140 is arranged so that the connection distance between the signal line 140a and the driver IC 120 is within, e.g., 375 μm. As a consequence, the high-frequency characteristics between the signal line 140a and the driver IC 120 can be kept. Further, the other end of the flexible substrate 140 is arranged so that the connection distance between the signal line 140a and the light emission element 130 is within, e.g., 375 μm. Thus, the high-frequency characteristics between the signal line 140a and the light emission element 130 can be kept.

Herein, the flexible substrate 140 comprises a plurality of DC lines 140b to 140f in addition to the signal line 140a. The DC lines 140b to 140f are connected to the electrical input units 111b to 111f, respectively. For example, the DC line 140b and the DC line 140c are power supply lines that supply power input from the electrical input unit 111b and the electrical input unit 111c to the driver IC 120.

Further, the DC line 140d is a power supply line that supplies the power input from the electrical input unit 111d to a Peltier element (which will be described later). Furthermore, the DC line 140e is a signal line that outputs the electrical signal output from a PD (Photo Detector) 160 to the electrical input unit 111e.

Herein, the PD 160 is a PD for monitoring an optical signal that partly receives the optical signals generated by the light emission element 130 and outputs an electrical signal based on the received optical signal. Further, the DC line 140f is a power supply line that supplies the power input from the electrical input unit 111f to the light emission element 130.

Furthermore, the flexible substrate 140 may have a plurality of the signal lines 140a. In this case, the flexible substrate 140 performs parallel transfer.

Figure 2:
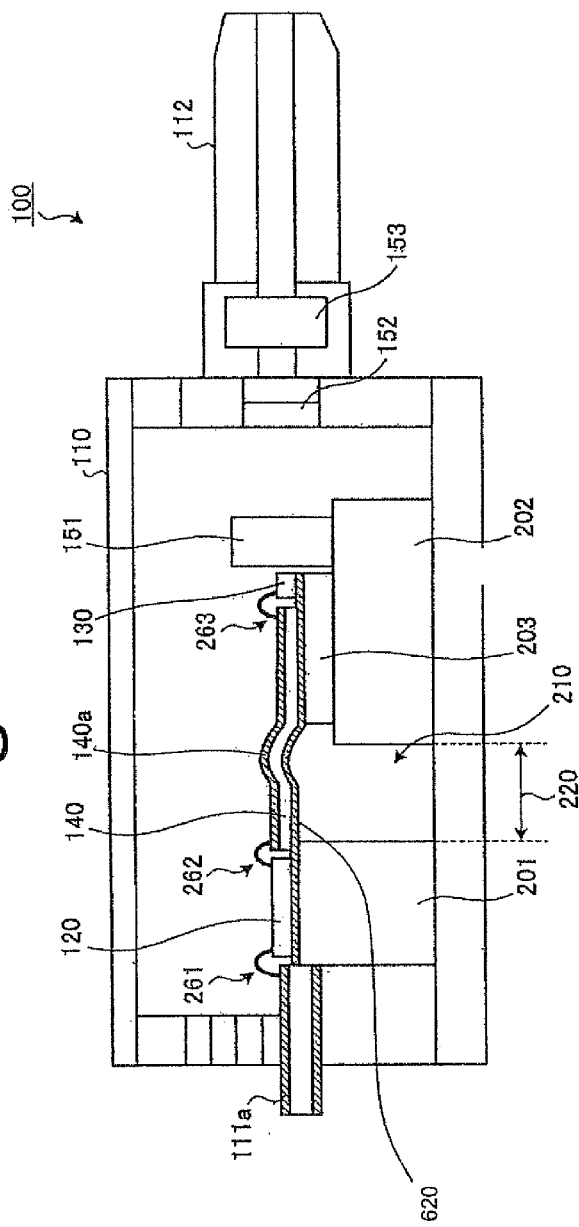
FIG. 2 is a cross-sectional view of an A-A line shown in FIG. 1.

FIG. 2 is a cross-sectional view of an A-A line shown in FIG. 1. Referring to FIG. 2, the same structure as that shown in FIG. 1 is designated by the same reference numerals, and a description thereof is omitted. Referring to FIG. 2, the driver IC 120 is fixed to the casing 110 by a fixing member 201. Specifically, one end of the flexible substrate 140 is fixed onto the fixing member 201 fixed to the casing 110, and the driver IC 120 is fixed to one end of the flexible substrate 140. The signal line is arranged on a top face of the flexible substrate 140. A ground plane is arranged on a bottom face of the flexible substrate 140.

The light emission element 130 is fixed to the casing 110 by a fixing member 202 and a Peltier element 203. Specifically, the Peltier element 203 is fixed onto the fixing member 202 fixed to the casing 110. The other end of the flexible substrate 140 is fixed onto the Peltier element 203. The light emission element 130 is fixed onto the other end of the flexible substrate 140.

The Peltier element 203 is driven by power supplied by the DC line 140d. The fixing member 202 contains, e.g., aluminum nitride (AlN). A portion to which the fixing member 201 and the fixing member 202 are fixed in the casing 110 and the fixing member 201 contain, e.g., copper tungsten (CuW). Here, the lens 151 in the optical coupling unit 150 is arranged on the fixing member 202. Position of the above parts may flexibly arrange in the casing. For example, the fixing member 202 is fixed onto the Peltier element 203 fixed to the casing 110, and the lines 151 and the lines 153 may flexibly arrange in optical pass of the casing 110.

Next, a description will be given of absorption operation with the above-mentioned structure. The flexible substrate 140 with flexibility is used, thereby keeping the high-frequency characteristics irrespective of the positional deviation between the driver IC 120 and the light emission element 130 and connecting the driver IC 120 to the light emission element 130.

For example, referring to FIG. 2, when the height of the driver IC 120 is deviated from that of the light emission element 130, the deviation of height can be absorbed by the flexible substrate 140. As a consequence, the connection distance of the connection portion using the wire can be 375 μm or less, and the high-frequency characteristics can be kept.

Therefore, it is possible to improve the tolerance with respect to the positional deviation between the driver IC 120 and the light emission element 130. Further, it is possible to improve the tolerance with respect to the positional deviation between the electrical input unit 111a and the optical output unit 112, resulting in the positional deviation between the driver IC 120 and the light emission element 130.

Next, a description will be given of the operation of heat conduction with the above-mentioned structure. The fixing member 201 has a function as a heat releasing member for diffusing the heat generated by the driver IC 120 to the casing 110. The heat generated by the driver IC 120 is conducted and diffused to the fixing member 201 and the casing 110.

The Peltier element 203 conducts the heat generated by the light emission element 130 to the fixing member 202 with the Peltier advantage. The fixing member 202 also has a function as a heat releasing member for diffusing the heat conducted by the Peltier element 203. The heat generated by the light emission element 130 is conducted to the Peltier element 203, the fixing member 202, and the casing 110, and is diffused.

Herein, if increasing a distance 220 between the fixing member 201 to which the driver IC 120 is arranged and the Peltier element 203 to which the light emission element 130 is arranged, the high-frequency characteristics can be kept with the flexible substrate 140 and the driver IC 120 can be connected to the light emission element 130.

As a consequence, the high-frequency characteristics between the driver IC 120 and the light emission element 130 can be kept and a space 210 can be also assured. For example, it is possible to set, to 1.5 mm or more, the distance 220 between the fixing member 201 for diffusing the heat of the driver IC 120 and the Peltier element 203 for diffusing the heat of the light emission element 130. Therefore, the driver IC 120 can be sufficiently separated from the light emission element 130 in view of the heat, and the driver IC 120 and the light emission element 130 can be stably operated.

Further, since the flexible substrate 140 can keep the high-frequency characteristics, the driver IC 120 is sufficiently separated from the light emission element 130 in view of the heat. Therefore, the size of the optical transmitter 100 can be reduced. Further, since the driver IC 120 is included in the casing 110, the size of the optical transceiver including the optical transmitter 100 can be reduced.

In addition, since the flexible substrate 140 enables the direct connection between the driver IC 120 and the light emission element 130, the connection portion using the wire can be reduced. Therefore, it is easy to keep the high-frequency characteristics between the driver IC 120 and the light emission element 130, and it is possible to improve the high-frequency characteristics. Further, the reduction in connection portion using the wire facilitates a manufacturing process of the optical transmitter 100.

Incidentally, the embodiment can also be applied to the case in which the driver IC 120 is not included in the casing 110 (refer to FIG. 11). In this case, the electrical input unit 111a is directly connected to the light emission element 130 with the signal line 140a in the flexible substrate 140. The flexible substrate 140 with flexibility is used, thereby connecting the electrical input unit 111a to the light emission element 130 while keeping the high-frequency characteristics, irrespective of the positional deviation between the electrical input unit 111a and the light emission element 130.

For example, as shown in FIG. 2, even if the height of the electrical input unit 111a is deviated from that of the light emission element 130, the deviation of height can be absorbed by the flexible substrate 140. As a consequence, the connection distance of the connection portion using the wire can be 375 μm or less, and the high-frequency characteristics can thus be kept. Therefore, it is possible to improve the tolerance with respect to the positional deviation between the electrical input unit 111a and the light emission element 130. Further, it is possible to improve the tolerance with respect to the positional deviation between the electrical input unit 111a and the optical output unit 112, resulting in the positional deviation between the electrical input unit 111a and the light emission element 130.

Further, the space 210 can be ensured while keeping the high-frequency characteristics between the electrical input unit 111a and the light emission element 130. Therefore, the Peltier element 203 that diffuses the heat of the light emission element 130 can sufficiently be separated from the casing 110 in view of the heat, and the light emission element 130 can stably be operated. In addition, since the high-frequency characteristics can be kept by the flexible substrate 140, the casing 110 is sufficiently separated from the light emission element 130 in view of the heat. Thus, the internal structure of the casing 110 is not necessarily complicated. Therefore, the size of the optical transmitter 100 can be reduced.

Figure 3:
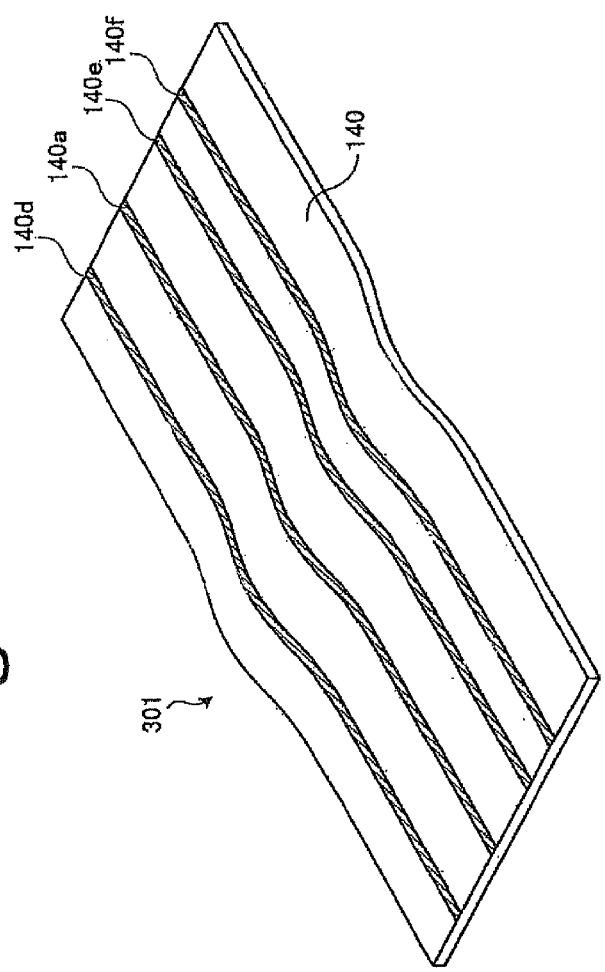
FIG. 3 is a perspective view showing a flexible substrate (No. 1) of the optical transmitter according to the embodiment.

FIG. 3 is a perspective view showing a flexible substrate (No. 1) of the optical transmitter according to the embodiment. Referring to FIG. 3, the DC line 140b and the DC line 140c shown in FIG. 1 are omitted (similarly in FIGS. 4 and 5). As shown in FIG. 3, the flexible substrate 140 in the optical transmitter 100 according to the embodiment has the flexibility in the Z axis direction in the drawing. Therefore, the flexible substrate 140 can absorb the deviation between the driver IC 120 and the light emission element 130 in the height direction (refer to FIG. 2).

Further, the flexible substrate 140 may have flexure 301 between the driver IC 120 and the light emission element 130. As a consequence, the flexible substrate 140 has the stretch property in the Y axis direction in the drawing. Thus, the flexible substrate 140 can absorb the deviation between the driver IC 120 and the light emission element 130 in the connection direction therebetween (refer to FIGS. 1 and 2). Even if the heat expansion changes the distance between the driver IC 120 and the light emission element 130, the flexure 301 of the flexible substrate 140 enables the absorption of the deviation.

Figure 4:
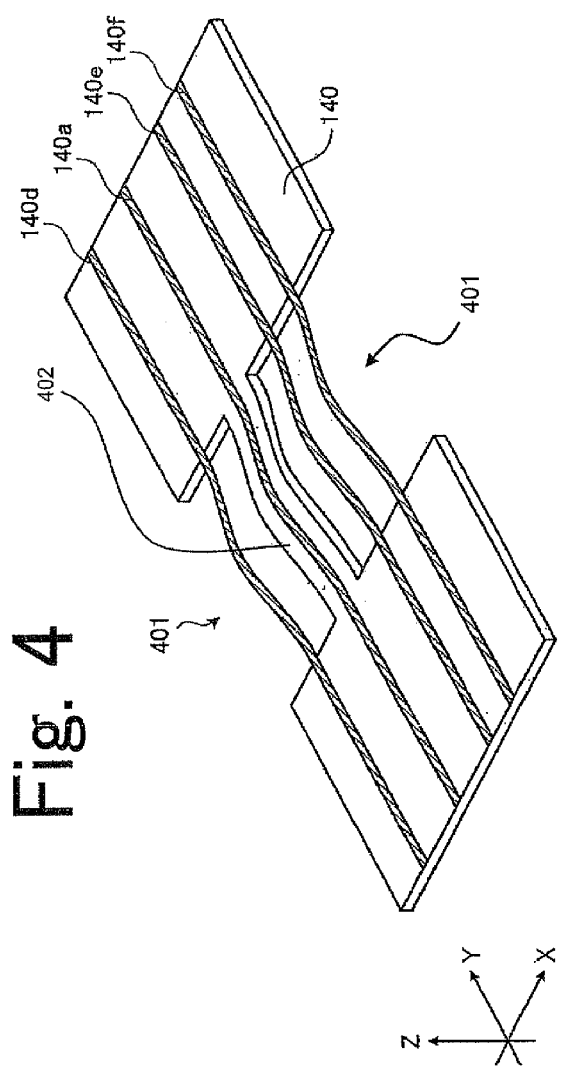
FIG. 4 is a perspective view showing a flexible substrate (No. 2) of the optical transmitter according to the embodiment.

FIG. 4 is a perspective view showing a flexible substrate (No. 2) in the optical transmitter according to the embodiment. Referring to FIG. 4, the flexible substrate 140 has the cutout portion or hollow portion 401 between the driver IC 120 and the light emission element 130. Herein, the cutout or hollow portion 401 is formed in the Y axis direction in the drawing (in the direction perpendicular to the connection direction between the driver IC 120 and the light emission element 130). Cutout portion or hollow portion 401 can form to cut out sides of the base material of the flexible substrate 140 in FIG. 3. The hollow or cutout portion 401 makes the remaining portion 402 on the flexible substrate 140. As a consequence, the remaining portion 402 to be narrowed by the hollow 401 on the flexible substrate 140 can be flexibly bent. Sides of the remaining portion 402 have the hollow portions 401.

Thus, it is possible to increase the flexibility in the Z axis direction and the stretch property in the Y direction in the drawing on the flexible substrate 140. Further, with the cutout or hollow 401, the flexible substrate 140 has the flexibility in the X axis direction in the drawing. Therefore, the flexible substrate 140 can absorb the deviations between the driver IC 120 and the light emission element 130 in the height direction of the driver IC 120 and the light emission element 130 and in the direction perpendicular to the connection direction (refer to FIG. 1).

Further, the flexible substrate 140 has the flexibility with respect to the twisting of the rotational direction with the axis, as center, in the Y direction in the drawing. Therefore, if the driver IC 120 is not in parallel with the light emission element 130 (refer to FIG. 2) and both of them are arranged at different angles, the flexible substrate 140 can absorb the deviation in angle.

Herein, the halfway portions of the DC line 140d, the DC line 140e, and the DC line 140f have a flying-lead structure in which an electrode remains and a basic material is deleted. The cutout or hollow 401 formed by deleting the basic material enables the flexible substrate 140 to have the above-mentioned flexibility. Further, the basic material remains at the forming portion of the signal line 140a on the flexible substrate 140, thereby keeping the high-frequency characteristics of the signal line 140a.

Figure 5:
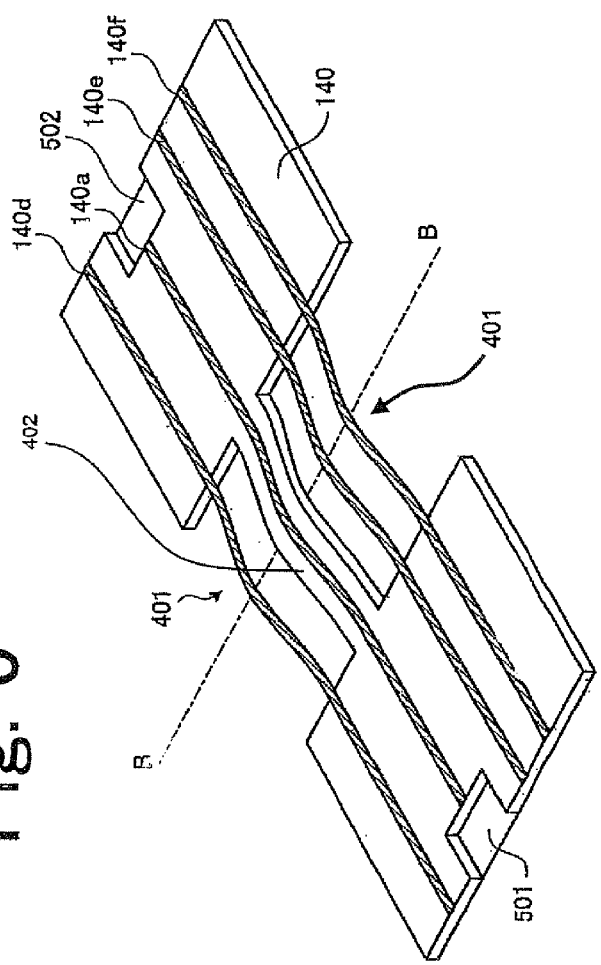
FIG. 5 is a perspective view showing a flexible substrate (No. 3) of the optical transmitter according to the embodiment.

FIG. 5 is a perspective view showing a flexible substrate (No. 3) in the optical transmitter according to the embodiment. Referring to FIG. 5, the flexible substrate 140 may have a device hole 501 and a device hole 502. The device hole 501 is a hole that is arranged to one end of the flexible substrate 140 to set the driver IC 120 at the connection position to the signal line 140a.

The device hole 502 is a hole that is arranged to the other end of the flexible substrate 140 to set the light emission element 130 at the connection position to the signal line 140a. The device hole 501 and the device hole 502 enable the height adjustment of the driver IC 120, the light emission element 130, and the signal line 140a, thereby easily keeping the high-frequency characteristics. More specifically, the device hole 501's depth is according to height of the driver IC 120, and the device hole 502's depth is according to height of the light receiving element 910.

Figure 6:
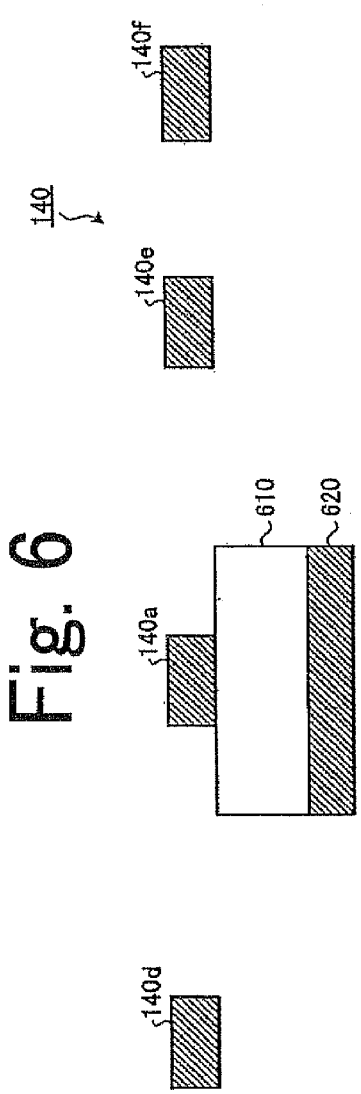
FIG. 6 is a cross-sectional view showing the flexible substrate of the optical transmitter according to the embodiment.

FIG. 6 is a cross-sectional view showing the flexible substrate in the optical transmitter according to the embodiment. FIG. 6 is a cross-sectional view of a B-B line shown in FIG. 5. Referring to FIG. 6, the signal line 140a is formed onto a surface of a base film 610 such as polymide or liquid crystal polymer. Further, the signal line 140a is a micro strip line in association with a ground plane 620 being arranged to opposite side of the signal line on the base film 610.

As a consequence, the signal line 140a can keep the high-frequency characteristics from the driver IC 120 to the light emission element 130. Further, on the B-B line in FIG. 5, the base film 610 at the forming portion of the DC line 140d, the DC line 140e, and the DC line 140f and the ground plane 620 are cut out (cutout or hollow portion 401).

Figure 7:
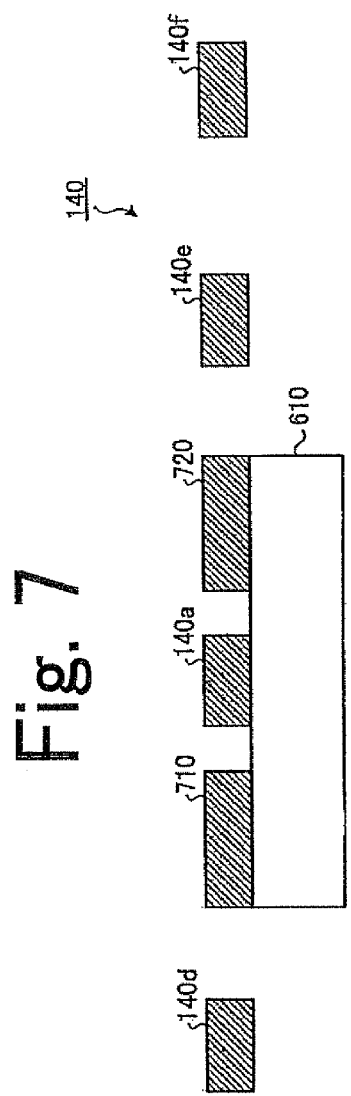
FIG. 7 is a cross-sectional view showing a flexible substrate of an optical transmitter according to a first modification of the embodiment.

FIG. 7 is a cross-sectional view showing a flexible substrate of the optical transmitter according to a first modification of the embodiment. Referring to FIG. 7, the signal line 140a may shape a coplanar line sandwiched by a ground plane 710 and a ground plane 720 formed onto the surface of the base film 610 instead of the ground plane 620 on the bottom face of the flexible substrate 140 of the FIG. 6. The ground plane 710 and the ground plane 720 are formed along the signal line 140a while keeping a constant distance to the signal line 140a.

As a consequence, the signal line 140a can keep the high-frequency characteristics from the driver IC 120 to the light emission element 130. In this case, on the B-B line in FIG. 5, the base film 610 at the forming position of the DC line 140d, the DC line 140e, and the DC line 140f is cut out.

Figure 8:
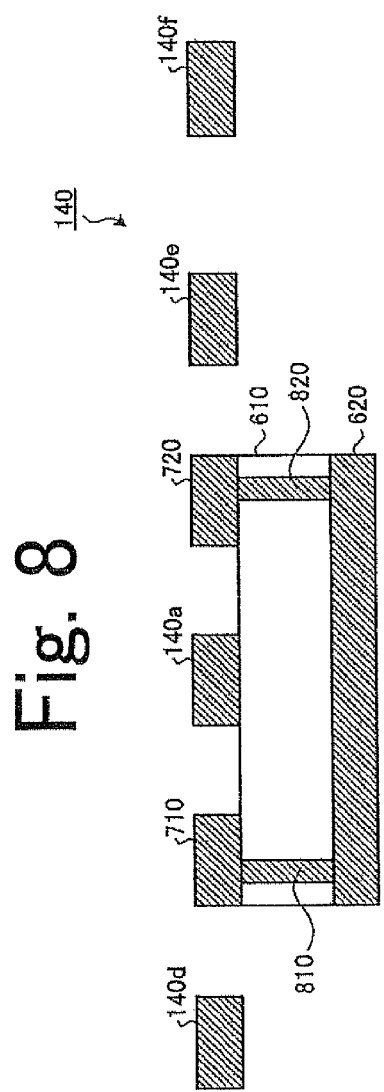
FIG. 8 is a cross-sectional view showing a flexible substrate of an optical transmitter according to a second modification of the embodiment.

FIG. 8 is a cross-sectional view showing a flexible substrate of the optical transmitter according to a second modification of the embodiment. Referring to FIG. 8, the signal line 140a may shape a grounded coplanar line sandwiched by the ground plane 710 and the ground plane 720 formed onto the surface of the base film 610 with the ground plane 620 arranged to the back surface of the base film 610. Herein, the ground plane 710 and the ground plane 720 are connected to the ground plane 620 via a 810 and a via 820.

Thus, the signal line 140a can keep the high-frequency characteristics from the driver IC 120 to the light emission element 130. In this case, on the B-B line in FIG. 5, the base film 610 at the forming position of the DC line 140d, the DC line 140e, and the DC line 140f and the ground plane 620 are also cut out.

Figure 9:
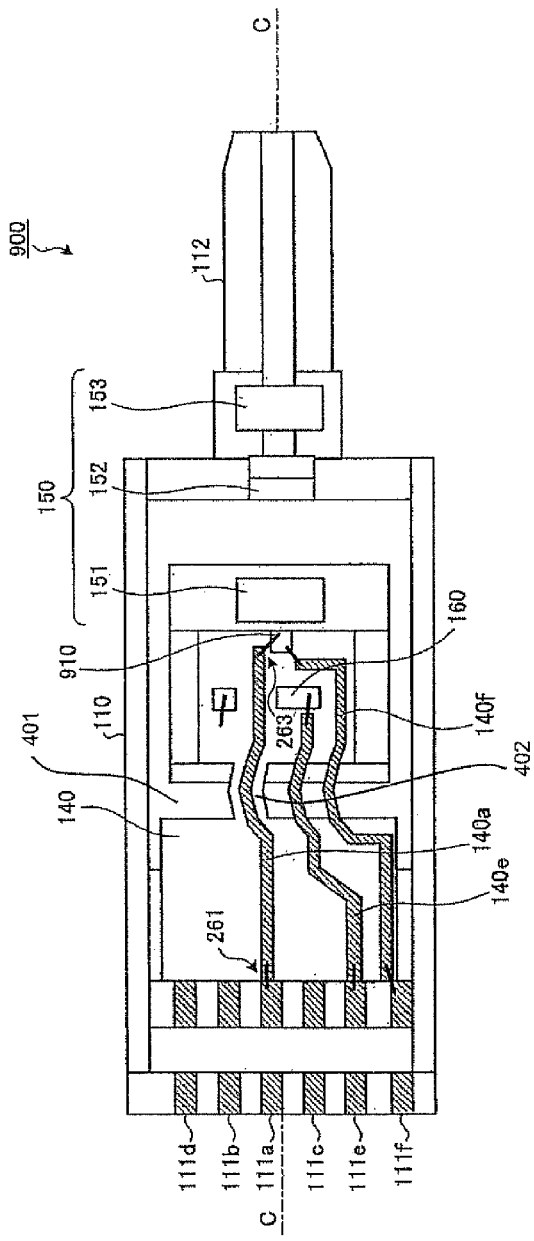
FIG. 9 is a plan view showing the optical receiver according to the embodiment.

FIG. 9 is a plan view showing an optical receiver according to the embodiment. Referring to FIG. 9, the same structure as that shown in FIG. 1 is designated by the same reference numeral and a description thereof is omitted. As shown in FIG. 9, an optical receiver 900 according to the embodiment comprises a light receiving element 910 and the flexible substrate 140 in the casing 110. Herein, the electrical input units 111a to 111f are set as electrical output units 111a to 111f, and the optical output unit 112 is set as an optical input unit 112.

The optical receiver 900 receives an optical signal by using the optical input unit 112. The optical coupling unit 150 passes through the optical signal input from the optical input unit 112 and enables the light receiving element 910 to couple the passing signals. Herein, the window 152 has a function of an optical isolator that passes through the optical signal only in the direction from the optical input unit 112 to the light receiving element 910.

The light receiving element 910 receives the optical signal input from the optical input unit 112 and passing through the optical coupling unit 150. The light receiving element 910 generates an electrical signal on the basis of the received optical signal. The light receiving element 910 outputs the generated electrical signal to the electrical output unit 111a via the signal line 140a on the flexible substrate 140. The light receiving element 910 is, e.g., a PD (Photo Detector).

The light receiving element 910 is arranged at the matching position of the optical input unit 112 so as to receive the optical signal output from the optical input unit 112. For example, the light receiving element 910 is arranged so that the precision of the positional deviation from the optical input unit 112 is within 100 µm. The signal line 140a on the flexible substrate 140 connects the light receiving element 910 to the electrical output unit 111a. As mentioned above, one end of the signal line 140a is connected to the electrical output unit 111a and, on the other hand, the light receiving element 910 is arranged at the matching position of the optical input unit 112.

Figure 10:
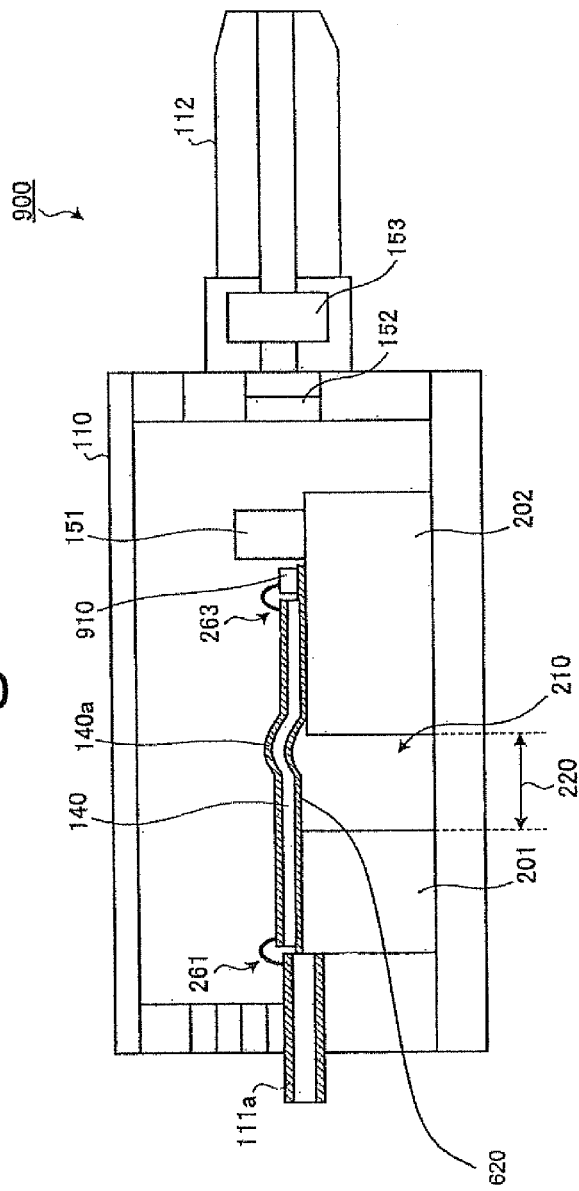
FIG. 10 is a cross-sectional view showing a C-C line shown in FIG. 9.

FIG. 10 is a cross-sectional view of a C-C line shown in FIG. 9. Referring to FIG. 10, the same structure as that shown in FIGS. 2 and 9 is designated by the same reference numeral and a description thereof is omitted. As shown in FIG. 10, the light receiving element 910 is fixed to the casing 110 by using the fixing member 202. Specifically, the other end of the flexible substrate 140 is fixed onto the fixing member 202 fixed to the casing 110. Further, the light receiving element 910 is fixed onto the other end of the flexible substrate 140.

The various flexible substrates 140 shown in FIGS. 3 to 8 can be applied to the flexible substrate 140. By using the flexible substrate 140 with flexibility, the high-frequency characteristics can be kept and the electrical output unit 111a can be also connected to the light receiving element 910, irrespective of the positional deviation between the electrical output unit 111a and the light receiving element 910.

For example, referring to FIG. 10, even if the height of the electrical output unit 111a is deviated from that of the light receiving element 910, the deviation in height can be absorbed by the flexible substrate 140. Accordingly, the connection distance of the connection portion using the wire can be within 375 µm or less, and the high-frequency characteristics can be kept.

As a consequence, it is possible to improve the tolerance with respect to the positional deviation between the electrical output unit 111a and the light receiving element 910. Further, it is possible to improve the tolerance with respect to the positional deviation between the electrical output unit 110 and the optical input unit 112, resulting in the positional deviation between the electrical output unit 111a and the light receiving element 910.

As mentioned above, the flexible substrate according to the embodiment has the notch portion in the middle of the flexible substrate and the flexibility is therefore high. Thus, even if the size of the flexible substrate is small, the flexibility can sufficiently be obtained. Further, the high-frequency characteristics of the signal line can be kept. Furthermore, another line other than the signal line has a flying-lead structure for passage though the notch portion, thereby forming the long notch portion. The flexibility can sufficiently be obtained.

In addition, with the flexible substrate and the optical transmitter according to the embodiment, the driver IC is connected to the light emission element on the flexible substrate, thereby keeping the high-frequency characteristics irrespective of the positional deviation between the driver IC and the light emission element. Further, the driver IC and the light emission element can sufficiently be separated in view of the heat without the conventional casing having a complicated internal structure. Thus, with the flexible substrate optical part, the optical transmitter, and the optical receiver according to the embodiment, the high-frequency characteristics can be kept and the size of the optical device can be reduced.

Incidentally, the optical transmitter and the optical receiver as described above according to the embodiment can be applied to optical communication apparatuses, such as an optical transmitting and receiving apparatus, a relay apparatus, and an OADM (Optical Add Drop Multiplexer) forming the optical communication system.

Above description of the embodiments, advantageously, the high-frequency characteristics can be kept and the size of the optical apparatus can be also reduced.

More specifically, the flexible substrate, optical part, optical transmitter, and optical receiver according to the embodiment are advantageous for a compact optical transceiver, and are particularly suitable to transmission and reception of an optical signal at a high velocity.

What is claimed is:
1. A flexible circuit board for connecting a first device and a second device, comprising:
   a base material comprising a flexible material having a first end adapted to connect with the first device, a second end adapted to connect with the second device, and a cutout arranged between the first end and the second end, the cutout being formed by removing a portion of the flexible material;

a signal line arranged on a surface of the flexible material, the signal line being capable of electrically connecting the first device and the second device; and a part of a DC line arranged over the cutout so that the part of the DC line is out of contact with the flexible base material, another part of the DC line arranged on the flexible material, and the DC line being capable of electrically connecting the first device and the second device.

2. The flexible circuit board of claim 1 wherein the base material has a hole arranged at the first one end of the base material to accommodate the first device.

3. The flexible circuit board of claim 1, wherein the cutout is arranged orthogonal to a direction of the signal line.

4. The flexible circuit board of claim 1, wherein the base material has a ground plane arranged on a bottom face of the base material.

5. The flexible circuit board of claim 1, wherein the signal line comprises a coplanar line structure in association with a couple of ground planes on the base material.

6. The flexible circuit board of claim 1, further comprising a couple ground planes arranged on the surface of the base material; and a ground plane arranged on a bottom face of the base material.

7. The flexible circuit board of claim 1, wherein the signal line comprises one or more signal lines.

8. An apparatus comprising:
a first device;
a second device; and
a flexible circuit board connecting the first device and the second device, the flexible circuit board comprising:
   a base material comprising a flexible material having a first end adapted to connect with the first device, a second end adapted to connect with the second device, and a cutout arranged between the first end and the second end, the cutout being formed by removing a portion of the flexible material;
   a signal line arranged on a surface of the base material, the signal line being capable of electrically connecting the first device and the second device; and
   a part of a DC line arranged over the cutout so that the part of the DC line is out of contact with the base material, another part of the DC line arranged on the base material, and the DC line being capable of electrically connecting the first device and the second device.

9. A flexible circuit board of claim 8, further comprising:
a first fixing member fixing the first device and diffusing heat of the first device radiating heat; and
a second fixing member fixing the second device and separated from the first fixing member.

10. A flexible circuit board for connecting a first device and a second device, comprising:
a flexible base material at opposite ends of which the first device and the second device are connected, the flexible material having a narrow section between the opposite ends formed by partially removing a portion of the flexible base material;
a signal line continuously formed on a surface of the flexible base material to electrically connect the first device and the second device, the signal line being formed on the flexible base material in the narrow section; and
an additional line partially formed on the flexible base material to electrically connect the first device and the second device, the additional line being partially formed outside the flexible base material so as to be out of contact with the flexible base material in the narrow section.

11. A flexible circuit board, comprising:
a flexible base material having a first end adapted to connect with a first device, a second end adapted to connect with a second device, and a cutout arranged between the first end and the second end;
a line to electrically connect the first device and the second device, the line having a first part extending over the cutout so that the first part of the line is out of contact with the flexible base material and a second part arranged on the flexible base material.

12. A flexible circuit board comprising:
a flexible substrate having a narrow section provided between a first end and a second end of the flexible substrate, the flexible substrate including a flexible material;
a wiring line arranged on a surface of the flexible material via the narrow section; and
another wiring line arranged at a position outside of the narrow section and having a first portion arranged on the surface of the flexible material between the first end and the second end, another portion of the another wiring line being arranged out of contact with the flexible substrate.

* * * * *